(12) United States Patent
Yahata et al.

(10) Patent No.: US 12,074,139 B2
(45) Date of Patent: Aug. 27, 2024

(54) SEMICONDUCTOR DEVICE HAVING DOLMEN STRUCTURE AND MANUFACTURING METHOD THEREFOR, AND SUPPORT PIECE FORMATION LAMINATE FILM AND MANUFACTURING METHOD THEREFOR

(71) Applicant: Resonac Corporation, Tokyo (JP)

(72) Inventors: Tatsuya Yahata, Tokyo (JP); Kohei Taniguchi, Tokyo (JP); Shintaro Hashimoto, Tokyo (JP); Yoshinobu Ozaki, Tokyo (JP); Kei Itagaki, Tokyo (JP)

( * ) Notice: Subject to any disclaimer, the term of this patent is extended or adjusted under 35 U.S.C. 154(b) by 140 days.

(21) Appl. No.: 17/439,402

(22) PCT Filed: Apr. 24, 2020

(86) PCT No.: PCT/JP2020/017728
§ 371 (c)(1),
(2) Date: Sep. 15, 2021

(87) PCT Pub. No.: WO2020/218523
PCT Pub. Date: Oct. 29, 2020

(65) Prior Publication Data
US 2022/0149008 A1     May 12, 2022

(30) Foreign Application Priority Data

Apr. 25, 2019   (WO) .................. PCT/JP2019/017701

(51) Int. Cl.
*H01L 25/065* (2023.01)
*H01L 25/00* (2006.01)

(52) U.S. Cl.
CPC .......... *H01L 25/0657* (2013.01); *H01L 25/50* (2013.01); *H01L 2225/0651* (2013.01);
(Continued)

(58) Field of Classification Search
CPC ................ H01L 25/0657; H01L 25/50; H01L 2225/0651; H01L 2225/06562; H01L 2225/06575; H10B 80/00
See application file for complete search history.

(56) References Cited

U.S. PATENT DOCUMENTS 5,499,128 A    3/1996  Hasegawa et al.
5,963,794 A    10/1999 Fogal et al.
(Continued)

FOREIGN PATENT DOCUMENTS

JP  2002-222889   8/2002
JP  2003-124433   4/2003
(Continued)

OTHER PUBLICATIONS

International Preliminary Report on Patentability with Written Opinion dated Nov. 4, 2021 for PCT/JP2019/017688.
(Continued)

*Primary Examiner* — Timor Karimy
(74) *Attorney, Agent, or Firm* — SOEI PATENT & LAW FIRM

(57) ABSTRACT

A support piece formation laminate film according to the present disclosure includes a base material film, a pressure-sensitive adhesive layer, and a support piece formation film, in this order, in which the support piece formation film has a multi-layer structure including at least a metal layer. The support piece formation laminate film is applied to a manufacturing process of a semiconductor device having a dolmen structure including a substrate, a first chip disposed on the substrate, a plurality of support pieces disposed around the first chip, on the substrate, and a second chip disposed to be supported by the plurality of support pieces and to cover the first chip.

4 Claims, 10 Drawing Sheets

(52) U.S. Cl.
CPC ............... *H01L 2225/06562* (2013.01); *H01L 2225/06575* (2013.01); *H01L 2225/06582* (2013.01)

(56) References Cited

U.S. PATENT DOCUMENTS

| | | | |
|---|---|---|---|
| 7,459,776 B1 * | 12/2008 | St. Amand | H01L 25/0657 257/E23.052 |
| 7,550,832 B2 | 6/2009 | Weng et al. | |
| 7,859,119 B1 | 12/2010 | St. Amand et al. | |
| 9,721,924 B2 | 8/2017 | Lee | |
| 2005/0133932 A1 | 6/2005 | Pohl et al. | |
| 2007/0181990 A1 | 8/2007 | Huang et al. | |
| 2008/0029885 A1 | 2/2008 | Meir et al. | |
| 2010/0219507 A1 * | 9/2010 | Misumi | H01L 24/32 438/464 |
| 2011/0175222 A1 * | 7/2011 | Kim | H01L 23/3128 257/737 |
| 2011/0256666 A1 | 10/2011 | Sugo et al. | |
| 2012/0181673 A1 | 7/2012 | Pagaila et al. | |
| 2013/0270717 A1 | 10/2013 | Ko et al. | |
| 2014/0167291 A1 * | 6/2014 | Nam | H01L 25/50 257/777 |
| 2016/0276223 A1 | 9/2016 | Priewasser | |
| 2020/0024891 A1 | 1/2020 | Abe et al. | |
| 2023/0187370 A1 | 6/2023 | Chen et al. | |

FOREIGN PATENT DOCUMENTS

| | | |
|---|---|---|
| JP | 2006-005333 | 1/2006 |
| JP | 2010-206136 | 9/2010 |
| JP | 2013-131557 | 7/2013 |
| JP | 2015-176906 | 10/2015 |
| JP | 2016-216562 | 12/2016 |
| JP | 2017-515306 | 6/2017 |
| JP | 2019-012841 | 1/2019 |
| TW | 201640642 | 11/2016 |

OTHER PUBLICATIONS

International Preliminary Report on Patentability with Written Opinion dated Nov. 4, 2021 for PCT/JP2019/017692.
International Preliminary Report on Patentability with Written Opinion dated Nov. 4, 2021 for PCT/JP2019/017701.
International Preliminary Report on Patentability with Written Opinion dated Nov. 4, 2021 for PCT/JP2020/017728.
International Preliminary Report on Patentability with Written Opinion dated Nov. 4, 2021 for PCT/JP2020/017731.
International Preliminary Report on Patentability with Written Opinion dated Nov. 4, 2021 for PCT/JP2020/017740.
International Search Report dated Jul. 9, 2019 for PCT/JP2019/017701.
International Search Report dated Jul. 28, 2020 for PCT/JP2020/017728.
International Search Report dated Jul. 9, 2019 for PCT/JP2019/017688.
International Search Report dated Jul. 9, 2019 for PCT/JP2019/017692.
International Search Report dated Jul. 21, 2020 for PCT/JP2020/017731.
International Search Report dated Jul. 28, 2020 for PCT/JP2020/017740.
Soei Patent and Law Firm, Statement of Related Matters, dated Nov. 9, 2021.

* cited by examiner

SEMICONDUCTOR DEVICE HAVING DOLMEN STRUCTURE AND MANUFACTURING METHOD THEREFOR, AND SUPPORT PIECE FORMATION LAMINATE FILM AND MANUFACTURING METHOD THEREFOR

CROSS-REFERENCE TO RELATED APPLICATION

This application is a 35 U.S.C. § 371 national phase application of PCT/JP2020/017728, filed on Apr. 24, 2020, which claims priority to PCT/JP2019/017701, filed on Apr. 25, 2019.

TECHNICAL FIELD

The present disclosure relates to a semiconductor device having a dolmen structure including a substrate, a first chip disposed on the substrate, a plurality of support pieces disposed around the first chip, on the substrate, and a second chip disposed to be supported by the plurality of support pieces and to cover the first chip. In addition, the present disclosure relates to a manufacturing method for a semiconductor device having a dolmen structure, and a support piece formation laminate film and a manufacturing method therefor. Note that, dolmen is a type of stone tomb, and includes a plurality of pillar stones, and a plate-shaped rock placed on the plurality of pillar stones. In the semiconductor device having a dolmen structure, the support piece corresponds to the "pillar stone", and the second chip corresponds to the "plate-shaped rock".

BACKGROUND ART

Recently, in the field of a semiconductor device, high integration, downsizing, and speed-up have been required. As one aspect of the semiconductor device, a structure in which a semiconductor chip is laminated on a controller chip disposed on a substrate has attracted attention. For example, in Patent Literature 1, a semiconductor die assembly including a controller die, and a memory die supported by a support member on the controller die is disclosed. It can be said that a semiconductor assembly 100 illustrated in FIG. 1A of Patent Literature 1 has a dolmen structure. That is, the semiconductor assembly 100 includes a package substrate 102, a controller die 103 disposed on the surface of the package substrate 102, memory dies 106a and 106b disposed above the controller die 103, and support members 130a and 130b supporting the memory die 106a.

CITATION LIST

Patent Literature

Patent Literature 1: Japanese Unexamined Patent Publication No. 2017-515306

SUMMARY OF INVENTION

Technical Problem

In Patent Literature 1, it is disclosed that as the support member (a support piece), a semiconductor material such as silicon can be used, and more specifically, a fraction of a semiconductor material that is obtained by dicing a semiconductor wafer can be used (refer to [0012], [0014], and FIG. 2 of Patent Literature 1). In order to manufacture a support piece for a dolmen structure by using a semiconductor wafer, as with the manufacturing of the general semiconductor chip, for example, each of the following processes is required:

(1) pasting a back grind tape to a semiconductor wafer;
(2) performing back grinding with respect to the semiconductor wafer;
(3) pasting a film including an adhesive layer and an adhesive agent layer (a dicing die bonding-integrated film) to a dicing ring and the semiconductor wafer after the back grinding that is disposed in the dicing ring;
(4) peeling off the back grind tape from the semiconductor wafer;
(5) singulating the semiconductor wafer;
(6) picking up a support piece including a laminated body of a semiconductor chip and a bonding adhesive piece from the adhesive layer; and
(7) compressing a plurality of support pieces in a predetermined position on a substrate.

The present disclosure provides a manufacturing method for a semiconductor device in which in a manufacturing process of a semiconductor device having a dolmen structure, a process of preparing a support piece can be simplified, and excellent pickup properties of the support piece can be attained. In addition, the present disclosure provides a semiconductor device having a dolmen structure, and a support piece formation laminate film and a manufacturing method therefor.

Solution to Problem

One aspect of the present disclosure relates to a manufacturing method for a semiconductor device having a dolmen structure. Such a manufacturing method includes the following processes:

(A) preparing a laminate film including a base material film, a pressure-sensitive adhesive layer, and a support piece formation film, in this order;
(B) forming support pieces on a surface of the pressure-sensitive adhesive layer by singulating the support piece formation film;
(C) picking up the support piece from the pressure-sensitive adhesive layer;
(D) disposing a first chip on a substrate;
(E) disposing a plurality of support pieces around the first chip or around a region in which the first chip is to be disposed, on the substrate;
(F) preparing an adhesive piece-attached chip including a second chip, and a bonding adhesive piece provided on one surface of the second chip; and
(G) constructing a dolmen structure by disposing the adhesive piece-attached chip on surfaces of the plurality of support pieces.

The support piece formation film has a multi-layer structure including at least a metal layer. According to the studies of the present inventors, in a case where a support piece formation film including a metal layer, and an ultraviolet-curable adhesive layer are used together, pickup properties of a support piece obtained by singulating the support piece formation film tend to be insufficient. That is, for example, in a case where the support piece formation film including the metal layer is singulated with a blade, the edge of a metal piece (obtained by singulating the metal layer) is likely to intrude into the adhesive layer due to the malleability of a metal. After that, since the edge of the metal piece is fixed to the cured adhesive layer in a case where the adhesive layer is cured by being irradiated with an ultraviolet ray, the present inventors assume that the pickup properties of the support piece tend to be insufficient. By adopting a pressure-sensitive adhesive layer (a pressure-sensitive adhesive layer) instead of the ultraviolet-curable adhesive layer, excellent pickup properties of the support piece can be attained even in a case where the support piece formation film includes the metal layer.

Either the process (D) or the process (E) may be performed first. In a case where the process (D) is performed first, in the process (E), the plurality of support pieces may be disposed around the first chip, on the substrate. On the other hand, in a case where the process (E) is performed first, in the process (E), the plurality of support pieces may be disposed around the region in which the first chip is to be disposed, on the substrate, and then, in the process (D), the first chip may be disposed in the region.

In the manufacturing method according to the present disclosure, the support piece obtained by singulating the support piece formation film is used. Accordingly, the process of preparing the support piece can be simplified, compared to the manufacturing method of the related art in which the fraction of the semiconductor material that is obtained by dicing the semiconductor wafer is used as the support piece. That is, in the related art, the processes of (1) to (7) described above were required, whereas since the support piece formation film does not include a semiconductor wafer, the processes of (1), (2), and (4) relevant to the back grinding of the semiconductor wafer can be omitted. In addition, since the semiconductor wafer that is more expensive than a resin material is not used, the cost can also be reduced.

Since the laminate film prepared in the process (A) includes the pressure-sensitive adhesive layer, a process of irradiating the pressure-sensitive adhesive layer with an ultraviolet ray may be performed between the process (B) and the process (C).

In a case where the support piece formation film includes a thermosetting resin layer, a process of curing the thermosetting resin layer or the bonding adhesive piece by heating the support piece formation film or the support piece may be performed at a suitable timing, and for example, may be performed before the process (G). In a stage where the adhesive piece-attached chip is disposed to be in contact with the surface of the plurality of support pieces, the deformation of the support piece due to the disposition of the adhesive piece-attached chip can by suppressed by curing in advance the thermosetting resin layer. Note that, since the thermosetting resin layer has adhesiveness with respect to other members (for example, the substrate), an adhesive agent layer or the like may not be separately provided on the support piece.

One aspect of the present disclosure relates to a semiconductor device having a dolmen structure. That is, such a semiconductor device has a dolmen structure including a substrate, a first chip disposed on the substrate, a plurality of support pieces disposed around the first chip, on the substrate, and a second chip disposed to be supported by the plurality of support pieces and to cover the first chip, and the support piece has a multi-layer structure including at least a metal piece.

The semiconductor device according to the present disclosure may further include a bonding adhesive piece that is provided on one surface of the second chip and is interposed between the second chip and the plurality of support pieces. In this case, the first chip may be apart from the bonding adhesive piece, or may be in contact with the bonding adhesive piece. The bonding adhesive piece, for example, is provided to cover at least a region of the second chip facing the first chip. The bonding adhesive piece may continuously extend to a circumferential edge side of the second chip from the region of the second chip and may be interposed between the second chip and the plurality of support pieces. That is, one bonding adhesive piece may cover the region of the second chip and may adhere the second chip and the plurality of support pieces to each other.

One aspect of the present disclosure relates to a support piece formation laminate film. Such a laminate film includes a base material film, a pressure-sensitive adhesive layer, and a support piece formation film, in this order, and the support piece formation film has a multi-layer structure including at least metal layer. Specific examples of the metal layer include a copper layer and an aluminum layer. Since it is not necessary that the pressure-sensitive adhesive layer is cured by being irradiated with an ultraviolet ray, the pressure-sensitive adhesive layer may not contain a resin having a photoreactive carbon-carbon double bond. Note that, the pressure-sensitive adhesive layer may contain the resin having a photoreactive carbon-carbon double bond. For example, in the pressure-sensitive adhesive layer, a predetermined region of the adhesive layer containing the resin having a carbon-carbon double bond may be irradiated with an ultraviolet ray adhesive layer to decrease the adhesiveness of the region, or the resin having a photoreactive carbon-carbon double bond may remain.

The thickness of the support piece formation film, for example, is 5 to 180 μm. By setting the thickness of the support piece formation film to be in such a range, a dolmen structure having a suitable height with respect to the first chip (for example, a controller chip) can be constructed. The support piece formation film may include a thermosetting resin layer. The thermosetting resin layer, for example, contains an epoxy resin, and it is preferable that the thermosetting resin layer contains an elastomer. Since the thermosetting resin layer configuring the support piece contains the elastomer, a stress in the semiconductor device can be relieved.

One aspect of the present disclosure relates to a manufacturing method for a support piece formation laminate film. Such a manufacturing method includes a process of forming an adhesive film including a base material film, and a pressure-sensitive adhesive layer formed on one surface of the base material film, and a process of laminating a support piece formation film on the surface of the pressure-sensitive adhesive layer, and the support piece formation film has a multi-layer structure including at least a metal layer.

The support piece formation laminate film including a thermosetting resin layer and a metal layer, for example, can be manufactured as follows. That is, a manufacturing method for such a support piece formation laminate film includes a process of preparing a laminate film including a base material film, a pressure-sensitive adhesive layer, and a thermosetting resin layer, in this order, and a process of forming a metal layer on the surface of the thermosetting resin layer.

Advantageous Effects of Invention

According to the present disclosure, a manufacturing method for a semiconductor device is provided in which in a manufacturing process of a semiconductor device having a dolmen structure, a process of preparing a support piece can be simplified, and excellent pickup properties of the support piece can be attained. In addition, according to the present disclosure, a semiconductor device having a dolmen structure, and a support piece formation laminate film and a manufacturing method therefor are provided.

DESCRIPTION OF EMBODIMENTS

Hereinafter, embodiments of the present disclosure will be described in detail, with reference to the drawings. However, the present invention is not limited to the following embodiments. Note that, herein, a "(meth)acrylic acid" indicates an acrylic acid or a methacrylic acid, and "(meth) acrylate" indicates acrylate or methacrylate corresponding thereto. "A or B" may include either A or B, or may include both of A and B.

Herein, the term of "layer" also includes a structure having a shape formed on the entire surface and a structure having a shape formed on a part of the surface when seen in the plan view. In addition, herein, the term of "process" includes not only an independent process, but also a process that is not clearly distinguishable from other processes insofar as a desired function of the process is attained. In addition, a numerical range represented by using "to" indicates a range including numerical values described before and after "to" as a minimum value and a maximum value, respectively.

Herein, in a case where there are a plurality of substances corresponding to each component in a composition, the content of each component in the composition indicates the total amount of the plurality of substances in the composition, unless otherwise noted. In addition, exemplified materials may be independently used, or two or more types thereof may be used by being combined, unless otherwise noted. In addition, in numerical ranges described in stages herein, an upper limit value or a lower limit value of a numerical range in one stage may be replaced with an upper limit value or a lower limit value of a numerical range in another stage. In addition, in a numerical range described herein, an upper limit value or a lower limit value of the numerical range may be replaced with values described in Examples.

First Embodiment (Semiconductor Device)

Figure 1:
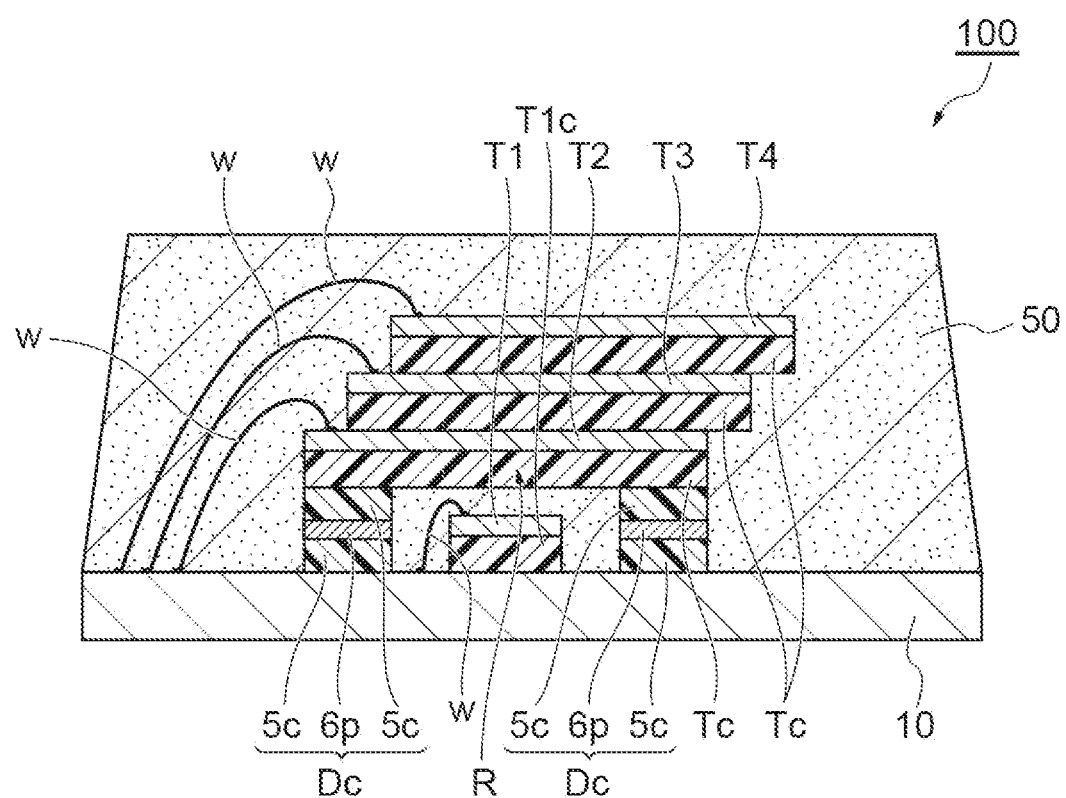
FIG. 1 is a sectional view schematically illustrating a first embodiment of a semiconductor device according to the present disclosure.

FIG. 1 is a sectional view schematically illustrating a semiconductor device according to this embodiment. A semiconductor device 100 illustrated in this drawing includes a substrate 10, a chip T1 (a first chip) disposed on the surface of the substrate 10, a plurality of support pieces Dc disposed around the chip T1, on the surface of the substrate 10, a chip T2 (a second chip) disposed above the chip T1, an bonding adhesive piece Tc interposed between the chip T2 and the plurality of support pieces Dc, chips T3 and T4 laminated on the chip T2, a plurality of wires w electrically connecting an electrode (not illustrated) on the surface of the substrate 10 and the chips T1 to T4, respectively, and a sealing material 50 filled in a gap between the chip T1 and the chip T2, or the like.

In this embodiment, the plurality of support pieces Dc, the chip T2, and the bonding adhesive piece Tc positioned between the support piece Dc and the chip T2 configure a dolmen structure on the substrate 10. The chip T1 is apart from the bonding adhesive piece Tc. By suitably setting the thickness of the support piece Dc, a space for the wire w connecting an upper surface of the chip T1 and the substrate 10 can be ensured. Since the chip T1 is apart from the bonding adhesive piece Tc, short circuit of the wire w due to a contact between an upper portion of the wire w connected to the chip T1 and the chip T2 can be prevented. In addition, since it is not necessary that the wire is embedded in the bonding adhesive piece Tc that is in contact with the chip T2, there is an advantage that the bonding adhesive piece Tc can be thinned.

As illustrated in FIG. 1, the bonding adhesive piece Tc between the chip T1 and the chip T2 covers a region R of the chip T2 facing the chip T1 and continuously extends to the circumferential edge side of the chip T2 from the region R. That is, one bonding adhesive piece Tc covers the region R of the chip T2 and adheres the chip T2 and the plurality of support pieces to each other by being interposed therebetween. Note that, in FIG. 1, an aspect is illustrated in which the bonding adhesive piece Tc is provided to cover the entire one surface (a lower surface) of the chip T2. However, since the bonding adhesive piece Tc can be contracted in a manufacturing procedure of the semiconductor device 100, the bonding adhesive piece Tc may substantially cover the entire one surface (the lower surface) of the chip T2, and for example, there may be a portion that is not covered with the bonding adhesive piece Tc in a part of the circumferential edge of the chip T2. In FIG. 1, the lower surface of the chip T2 corresponds to a back surface of a chip. Recently, concavities and convexities are commonly formed on the back surface of the chip. Since substantially the entire back surface of the chip T2 is covered with the bonding adhesive piece Tc, the occurrence of a crack or a split on the chip T2 can be suppressed.

The substrate 10 may be an organic substrate, or may be a metal substrate such as a lead frame. The thickness of substrate 10, for example, is 90 to 300 μm, and may be 90 to 210 μm, from the viewpoint of suppressing the warpage of the semiconductor device 100.

The chip T1, for example, is a controller chip, and is adhered to the substrate 10 by a bonding adhesive piece T1c and is electrically connected to the substrate 10 by the wire w. The shape of the chip T1 in the planar view, for example, is a quadrangular shape (a square shape or a rectangular shape). The length of one side of the chip T1, for example, is less than or equal to 5 mm, and may be 2 to 5 mm or 1 to 5 mm. The thickness of the chip T1, for example, is 10 to 150 µm, and may be 20 to 100 µm.

The chip T2, for example, is a memory chip, and is adhered onto the support piece Dc via the bonding adhesive piece Tc. The chip T2 has a size larger than that of the chip T1, in the planar view. The shape of the chip T2 in the planar view, for example, is a quadrangular shape (a square shape or a rectangular shape). The length of one side of the chip T2, for example, is less than or equal to 20 mm, and may be 4 to 20 mm or 4 to 12 mm. The thickness of the chip T2, for example, is 10 to 170 µm, and may be 20 to 120 µm. Note that, the chips T3 and T4, for example, are a memory chip, and are adhered onto the chip T2 via the bonding adhesive piece Tc. The length of one side of the chips T3 and T4 may be identical to that of the chip T2, and the thickness of the chips T3 and T4 may also be identical to that of the chip T2.

Figure 2A:
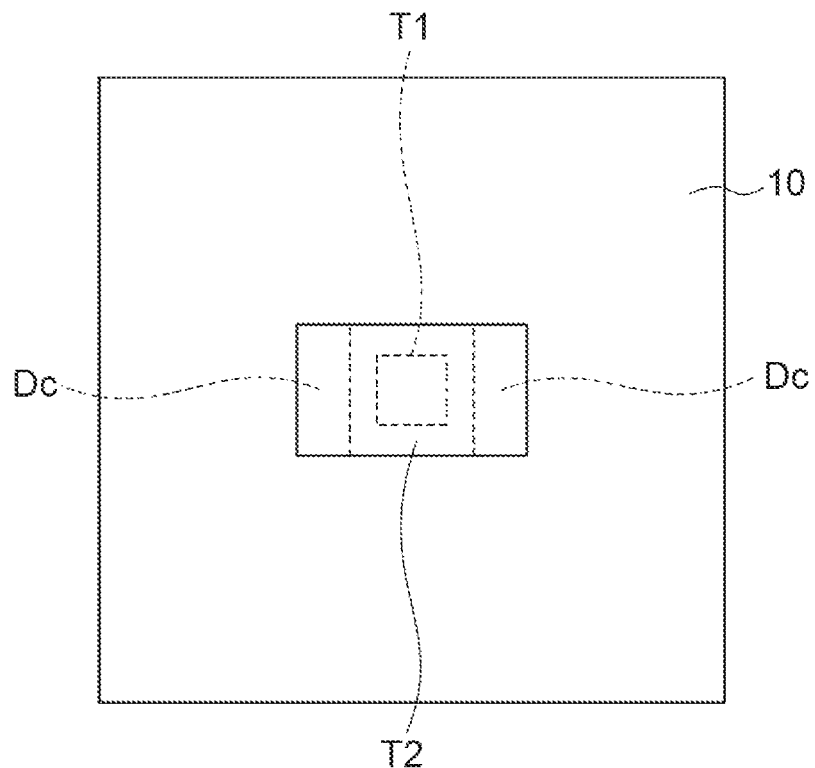
FIG. 2A and FIG. 2B are plan views schematically illustrating an example of a positional relationship between a first chip and a plurality of support pieces.
Figure 2B:
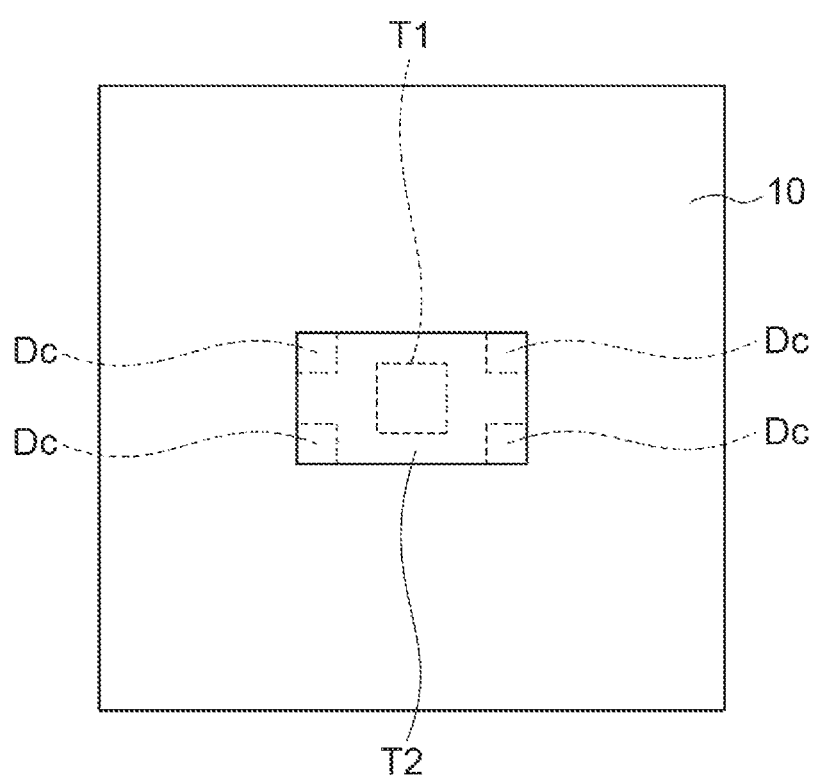

The support piece Dc serves in the role of a spacer for forming a space around the chip T1. The support piece Dc includes two bonding adhesive pieces 5c, and a metal piece 6p interposed between the bonding adhesive pieces 5c. The bonding adhesive piece 5c contains a cured product of a thermosetting resin composition (a bonding adhesive piece 5p). The metal piece 6p contains a metal material (for example, copper or aluminum). Note that, as illustrated in FIG. 2A, two support pieces Dc (Shape: a rectangular shape) may be disposed in separated positions on both sides of the chip T1, or as illustrated in FIG. 2B, one support piece Dc (Shape: a square shape, a total of 4) may be disposed in each position corresponding to the corner of the chip T1. The length of one side of the support piece Dc in the planar view, for example, is less than or equal to 20 mm, and may be 1 to 20 mm or 1 to 12 mm. The thickness (the height) of the support piece Dc, for example, is 10 to 180 µm, and may be 20 to 120 µm.

A ratio of the total thickness of the two bonding adhesive pieces 5c and 5c to the thickness of the support piece Dc is preferably 0.1 to 0.9, is more preferably 0.2 to 0.8, is even more preferably 0.35 to 0.7, and is still even more preferably 0.35 to 0.6. By setting such a ratio to be in the range described above, in a manufacturing procedure of the support piece Da, pickup properties can be attained (refer to FIG. 5D). That is, in a case where the ratio is greater than or equal to 0.1, a decrease in the pickup properties of the support piece Da due to the intrusion of the edge of the metal piece 6p into a pressure-sensitive adhesive layer 2 can be more highly suppressed. On the other hand, in a case where the ratio is less than or equal to 0.9, the metal piece 6p has a sufficient thickness such that the metal piece 6p serves in the role of a spring plate, and more excellent pickup properties can be attained. From such a viewpoint, the thickness of the metal piece 6p, for example, is 10 to 80 µm, and may be 20 to 60 µm. The thickness of the bonding adhesive piece 5c (one layer), for example, is 5 to 120 µm, and may be 10 to 60 µm.

(Preparation Method for Support Piece)

An example of a preparation method for a support piece will be described. Note that, the support piece Dc illustrated in FIG. 1 is in a state after the bonding adhesive piece (the thermosetting resin composition) in the support piece Dc is cured. On the other hand, the support piece Da is in a state before the bonding adhesive piece (the thermosetting resin composition) in the support piece Da is completely cured (for example, refer to FIG. 5B).

Figure 3A:
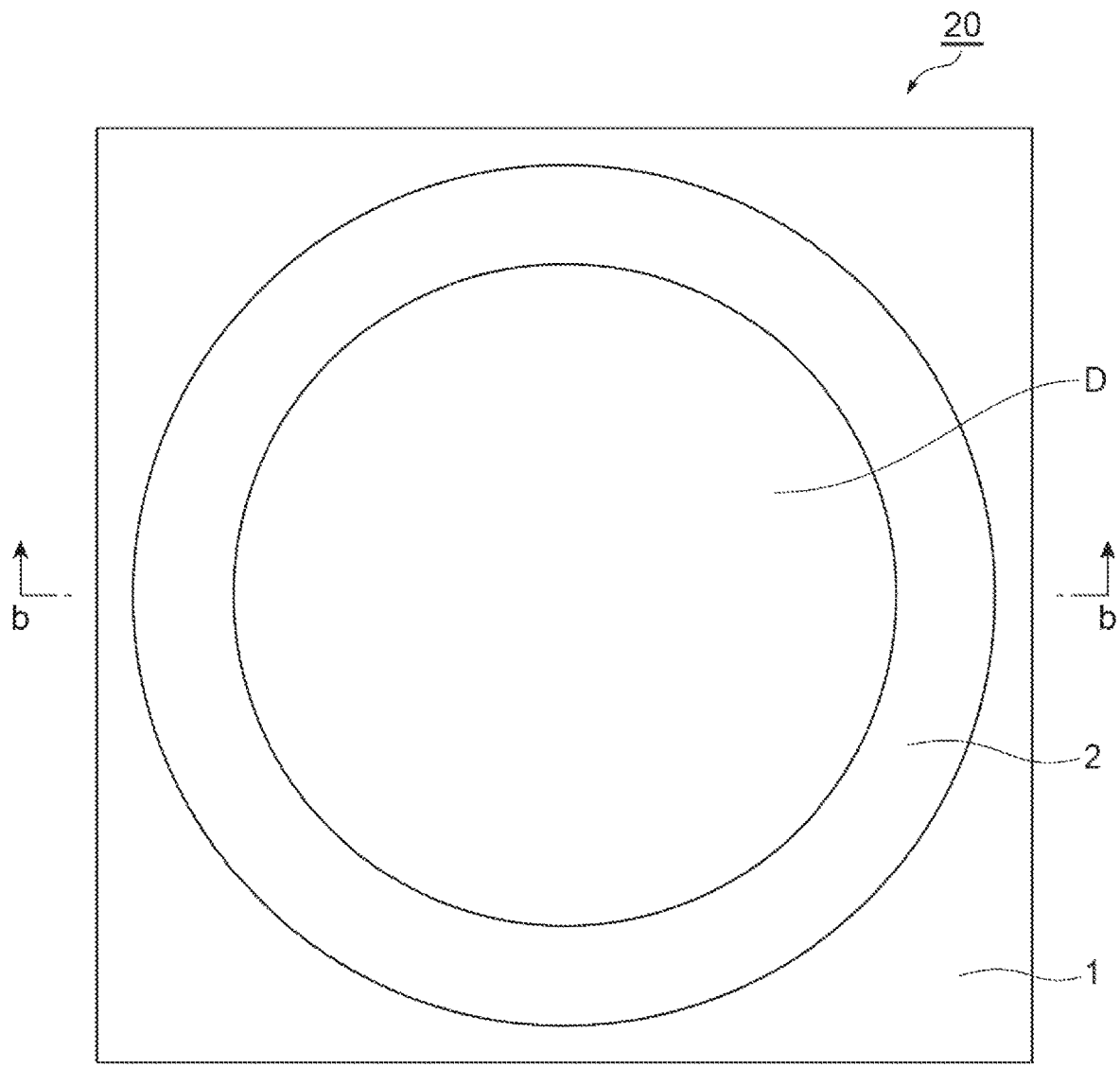
FIG. 3A is a plan view schematically illustrating one embodiment of a support piece formation laminate film.
Figure 3B:
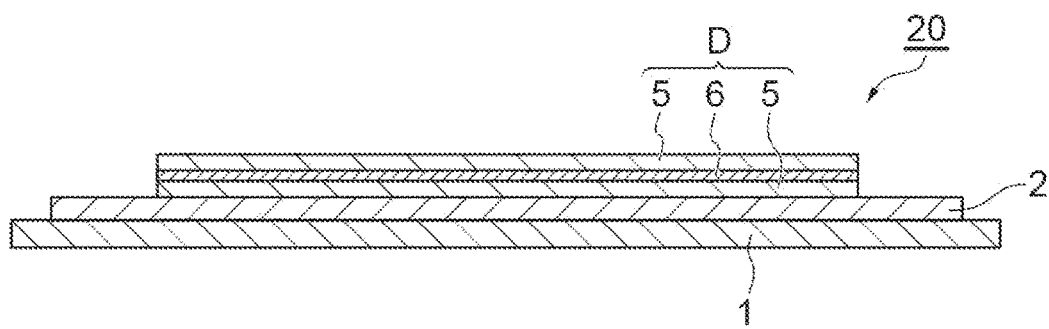
FIG. 3B is a sectional view taken along line b-b of FIG. 3A.

First, a support piece formation laminate film 20 (hereinafter, may be referred to as a "laminate film 20") illustrated in FIG. 3A and FIG. 3B is prepared. The laminate film 20 includes a base material film 1, a pressure-sensitive adhesive layer 2, and a support piece formation film D. The base material film 1, for example, is a polyethylene terephthalate film (a PET film). The pressure-sensitive adhesive layer 2 is formed into a circular shape by punching or the like (refer to FIG. 3A). The support piece formation film D is formed into a circular shape by punching or the like, and has a diameter smaller than that of the pressure-sensitive adhesive layer 2 (refer to FIG. 3A). The support piece formation film D includes two thermosetting resin layers 5, and a metal layer 6 interposed between the thermosetting resin layers 5.

The thickness of the thermosetting resin layer 5, for example, is 5 to 180 µm, and may be 10 to 170 µm or 15 to 160 µm. The thicknesses of two thermosetting resin layers 5 may be identical to each other, or may be different from each other. The metal layer 6, for example, is a copper layer or an aluminum layer. The thermosetting resin layer 5 contains a thermosetting resin composition. The thermosetting resin composition can be in a semi-cured (a B-stage) state, and then, in a completely cured product (a C-stage) state by the subsequent curing treatment. The thermosetting resin composition contains an epoxy resin, a curing agent, and an elastomer (for example, an acrylic resin), and as necessary, further contains an inorganic filler, a curing accelerator, and the like. The compositions of two thermosetting resin layers 5 may be identical to each other, or may be different from each other. The details of the thermosetting resin composition configuring the thermosetting resin layer 5 will be described below.

The thickness of the metal layer 6, for example, is 5 to 100 µm, and may be 10 to 90 µm or 20 to 80 µm. By setting the thickness of the metal layer 6 to be in the range described above, in a process of picking up the support piece Da (refer to FIG. 5D), the metal piece 6p serves in the role of a spring plate, and excellent pickup properties can be attained. In addition, since the laminate film 20 includes the metal layer 6, excellent visibility of the support piece Da can be attained in the pickup process by optical contrast between a resin material and a metal material.

A ratio of the total thickness of the two thermosetting resin layers 5 and 5 to the thickness of the support piece formation film D is preferably 0.1 to 0.9, is more preferably 0.2 to 0.8, is even more preferably 0.35 to 0.7, and is still even more preferably 0.35 to 0.6. By setting such a ratio to be in the range described above, in the manufacturing procedure of the support piece Da, the pickup properties can be attained (refer to FIG. 5D). That is, in a case where the ratio is greater than or equal to 0.1, a decrease in the pickup properties of the support piece Da due to the intrusion of the edge of the metal piece 6p into the pressure-sensitive adhesive layer 2 can be more highly suppressed. On the other hand, in a case where the ratio is less than or equal to 0.9, the metal piece 6p has a sufficient thickness such that the metal piece 6p serves in the role of a spring plate, and more excellent pickup properties can be attained. From such a viewpoint, the thickness of the metal layer 6, for example, is 10 to 80 µm, and may be 20 to 60 µm. The thickness of the thermosetting resin layer 5 (one layer), for example, is 5 to 120 µm, and may be 10 to 60 µm.

Figure 4:
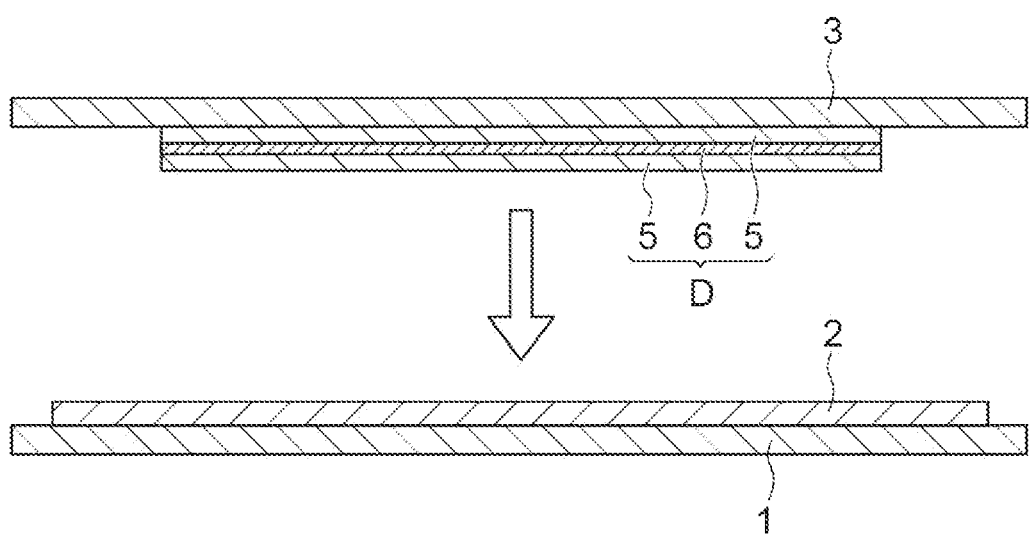
FIG. 4 is a sectional view schematically illustrating a process of bonding a pressure-sensitive adhesive layer and a support piece formation film.

The laminate film 20, for example, can be prepared by bonding a first laminate film including the base material film 1 and the pressure-sensitive adhesive layer 2 on the surface of the base material film 1, and a second laminate film including a cover film 3 and the support piece formation film D on the surface of the cover film 3 (refer to FIG. 4). The first laminate film is obtained through a process of forming the pressure-sensitive adhesive layer on the surface of the base material film 1 by coating, and a process of processing the pressure-sensitive adhesive layer into a predetermined shape (for example, a circular shape) by punching or the like. The second laminate film is obtained through a process of forming the thermosetting resin layer 5 on the surface of the cover film 3 (for example, a PET film or a polyethylene film) by coating, a process of forming the metal layer 6 on the surface of the thermosetting resin layer 5, a process of forming the thermosetting resin layer 5 on the surface of the metal layer 6 by coating, and a process of processing the support piece formation film formed through the processes described above into a predetermined shape (for example, a circular shape) by punching or the like. When the laminate film 20 is used, the cover film 3 is peeled off at a suitable timing.

Figure 5A:
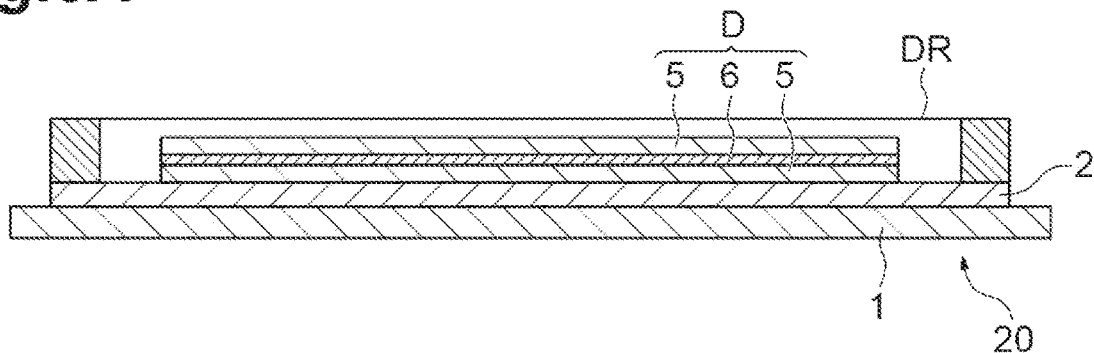
FIG. 5A to FIG. 5D are sectional views schematically illustrating a preparation procedure of a support piece.
Figure 5B:
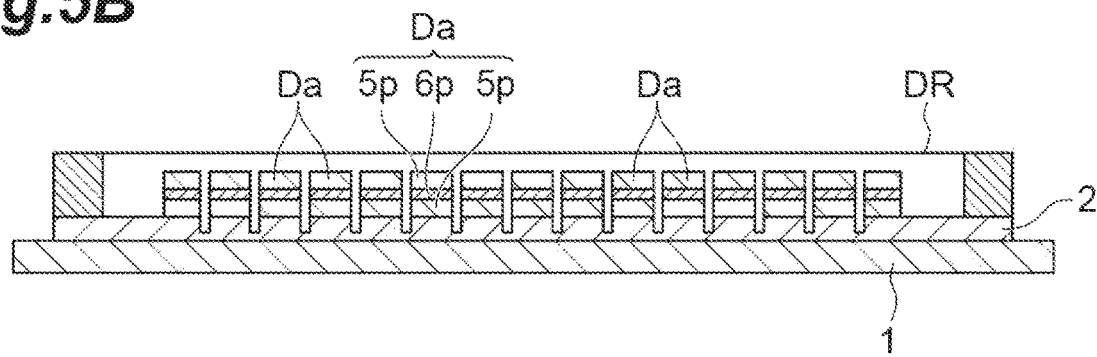
Figure 5C:
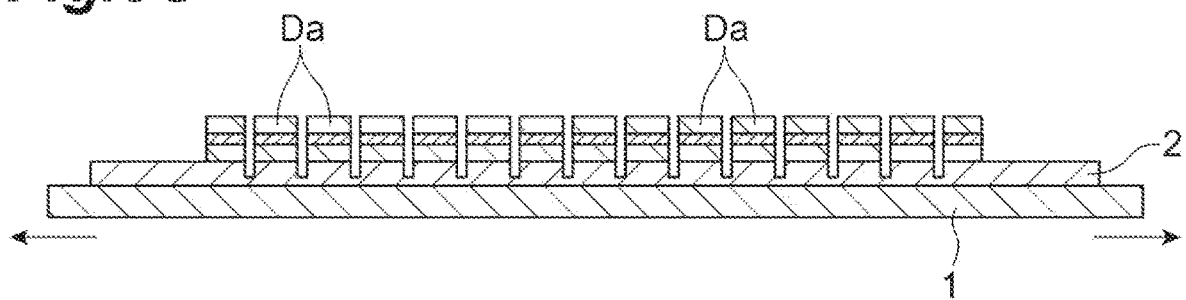
Figure 5D:
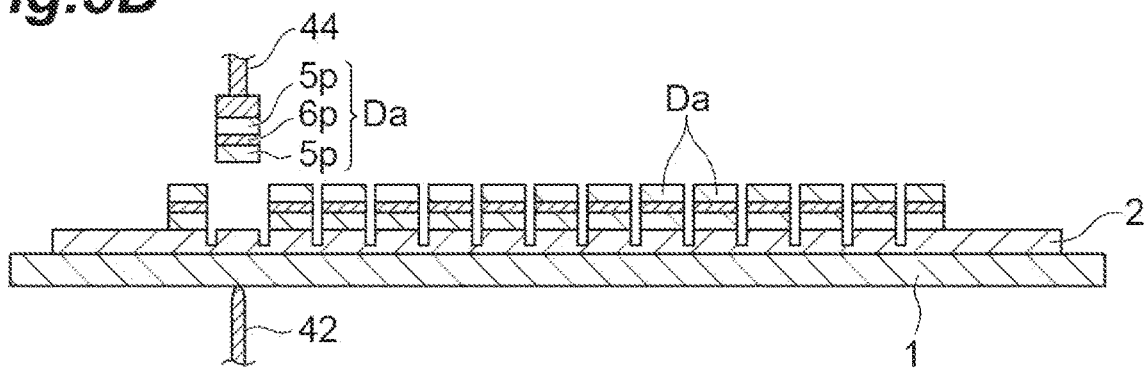

As illustrated in FIG. 5A, a dicing ring DR is pasted to the laminate film 20. That is, the dicing ring DR is pasted to the pressure-sensitive adhesive layer 2 of the laminate film 20 such that the support piece formation film D is disposed inside the dicing ring DR. The support piece formation film D is singulated by dicing (refer to FIG. 5B). Accordingly, a plurality of support pieces Da are obtained from the support piece formation film D. The support piece Da includes two bonding adhesive pieces 5p, and the metal piece 6p interposed between the bonding adhesive pieces 5p. After that, as illustrated in FIG. 5C, the support pieces Da are separated from each other by the expansion of the base material film 1. As illustrated in FIG. 5D, the support piece Da is thrust up by a thrust-up jig 42 such that the support piece Da is peeled off from the pressure-sensitive adhesive layer 2 and the support piece Da is picked up by being sucked with a suction collet 44. Note that, a curing reaction of a thermosetting resin may be advanced by heating the support piece formation film D before dicing or the support piece Da before pickup. Since the support piece Da is suitably cured at the time of being picked up, excellent pickup properties can be attained. It is preferable that a cutout for singulation is formed to the outer edge of the support piece formation film D. The diameter of the support piece formation film D, for example, may be 300 to 310 mm or 300 to 305 mm. The shape of the support piece formation film D in the planar view is not limited to a circular shape illustrated in FIG. 3A, and may be a quadrangular shape (a square shape or a rectangular shape).

(Manufacturing Method for Semiconductor Device)

A manufacturing method for the semiconductor device 100 will be described. A manufacturing method according to this embodiment includes the following processes (A) to (H):

(A) preparing the laminate film 20 (refer to FIG. 4);
(B) forming the support pieces Da on the surface of the pressure-sensitive adhesive layer 2 by singulating the support piece formation film D (refer to FIG. 5B);
(C) picking up the support piece Da from the pressure-sensitive adhesive layer 2 (refer to FIG. 5D);
(D) disposing the first chip T1 on the substrate 10;
(E) disposing a plurality of support pieces Da around the first chip T1, on the substrate 10 (refer to FIG. 6);
(F) preparing an adhesive piece-attached chip T2a including a second chip T2, and a bonding adhesive piece Ta provided on one surface of the second chip T2 (refer to FIG. 7);
(G) constructing a dolmen structure by disposing the adhesive piece-attached chip T2a on the surfaces of the plurality of support pieces Dc (refer to FIG. 8); and
(H) sealing the gap between the chip T1 and the chip T2, or the like, with the sealing material 50 (refer to FIG. 1).

The processes (A) to (C) are a process for preparing the support pieces Da, which have already been described. The processes (D) to (H) are a process for constructing the dolmen structure on the substrate 10 by using the plurality of support pieces Da. Hereinafter, the processes (D) to (H) will be described with reference to FIGS. 6 to 8.

[Process (D)]

The process (D) is a process of disposing the first chip T1 on the substrate 10. For example, first, the chip T1 is disposed in a predetermined position on the substrate 10 via the adhesive agent layer T1c. After that, the chip T1 is electrically connected to the substrate 10 by the wire w. The process (D) may be a process performed before the process (E), or may be a process performed before the process (A), between the process (A) and the process, (B) between the process (B) and the process (C), or between the process (C) and the process (E).

[Process (E)]

Figure 6:
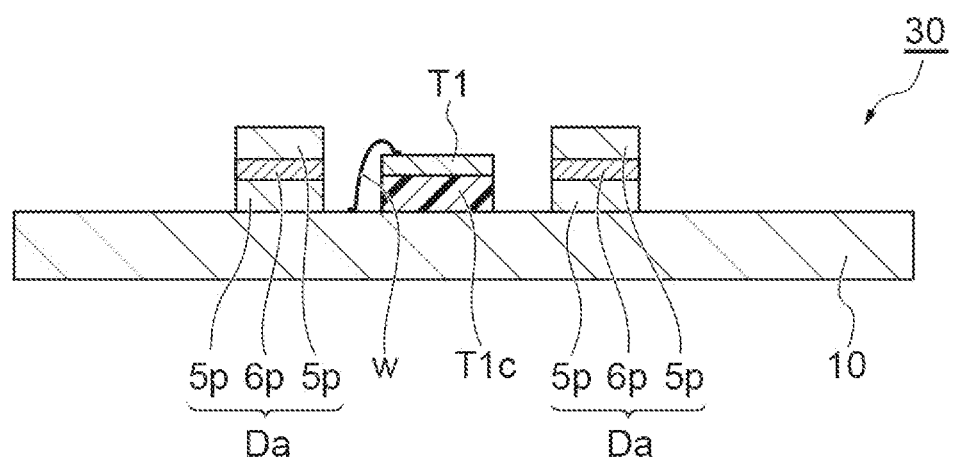
FIG. 6 is a sectional view schematically illustrating a state in which a plurality of support pieces are disposed around a first chip, on a substrate.

The process (E) is a process of disposing the plurality of support pieces Da around the first chip T1, on the substrate 10. Through this process, a structural body 30 illustrated in FIG. 6 is prepared. The structural body 30 includes the substrate 10, and the chip T1 and the plurality of support pieces Da disposed on the surface of the substrate 10. The support piece Da may be disposed by a compression treatment. It is preferable that the compression treatment, for example, is performed in a condition of 80 to 180° C., and 0.01 to 0.50 MPa, for 0.5 to 3.0 seconds. Note that, the support piece Da may become the support piece Dc by the bonding adhesive piece 5p in the support piece Da being completely cured at a time point of the process (E), or the bonding adhesive piece 5p may not be completely cured at the time point. The bonding adhesive piece 5p in the support piece Da may become the bonding adhesive piece 5c by being completely cured at a time point before the process (G) starts.

[Process (F)]

Figure 7:
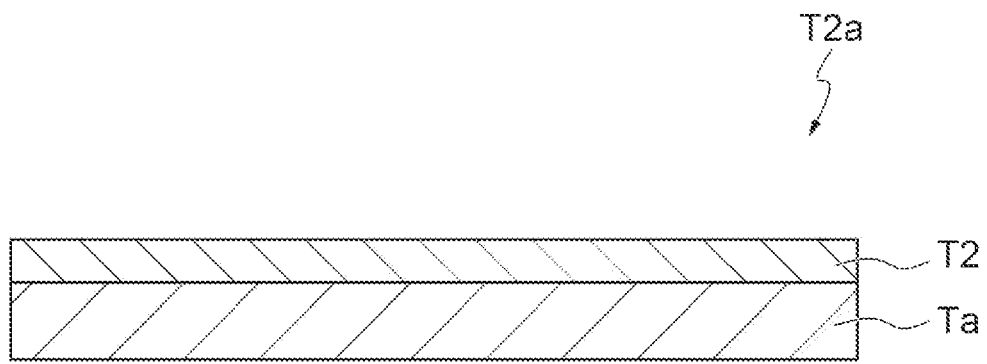
FIG. 7 is a sectional view schematically illustrating an example of an adhesive piece-attached chip.
Figure 8:
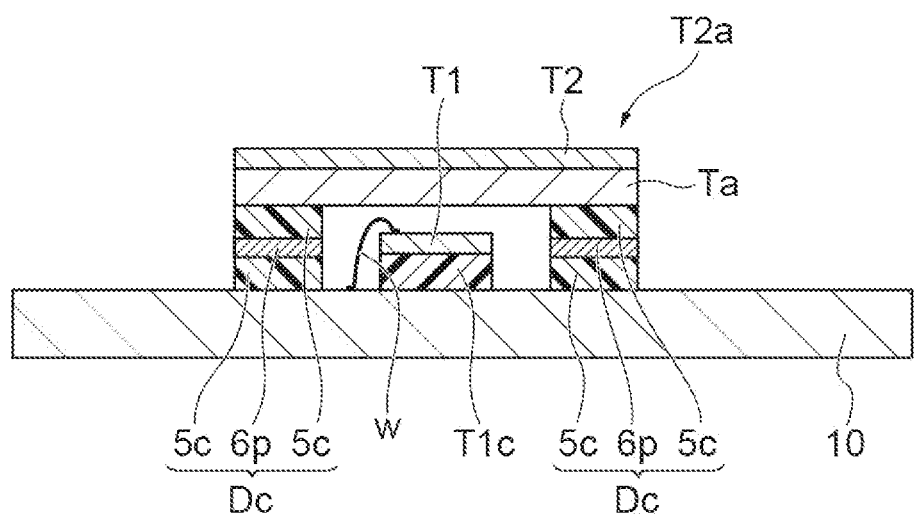
FIG. 8 is a sectional view schematically illustrating a dolmen structure formed on a substrate.

The process (F) is a process of preparing the adhesive piece-attached chip T2a illustrated in FIG. 7. The adhesive piece-attached chip T2a includes the chip T2, and the bonding adhesive piece Ta provided on one surface of the chip T2. The adhesive piece-attached chip T2a, for example, can be obtained by using a semiconductor wafer and a dicing die bonding-integrated film through a dicing process and a pickup process.

[Process (G)]

The process (G) is a process of disposing the adhesive piece-attached chip T2a above the chip T1 such that the bonding adhesive piece Ta is in contact with the upper surfaces of the plurality of support pieces Dc. Specifically, the chip T2 is compressed against the upper surface of the support piece Dc via the bonding adhesive piece Ta. It is preferable that such a compression treatment, for example, is performed in a condition of 80 to 180° C. and 0.01 to 0.50 MPa, for 0.5 to 3.0 seconds. Next, the bonding adhesive piece Ta is cured by heating. It is preferable that such a curing treatment, for example, is performed in a condition of 60 to 175° C. and 0.01 to 1.0 MPa, for longer than or equal to 5 minutes. Accordingly, the bonding adhesive piece Ta is cured to be the bonding adhesive piece Tc. Through this process, the dolmen structure is constructed on the substrate 10 (refer to FIG. 8). Since the chip T1 is apart from the adhesive piece-attached chip T2a, the short circuit of the wire w due to the contact between the upper portion of the wire w and the chip T2 can be prevented. In addition, since it is not necessary that the wire is embedded in the bonding adhesive piece Ta that is in contact with the chip T2, there is an advantage that the bonding adhesive piece Ta can be thinned.

The chip T3 is disposed on the chip T2 via a bonding adhesive piece, and the chip T4 is disposed on the chip T3 via a bonding adhesive piece, before the process (H) and after the process (G). The bonding adhesive piece may contain the same thermosetting resin composition as that of the bonding adhesive piece Ta described above, and becomes the bonding adhesive piece Tc by heating and curing (refer to FIG. 1). On the other hand, each of the chips T2, T3, and T4 is electrically connected to the substrate 10 by the wire w. Note that, the number of chips to be laminated above the chip T1 is not limited to 3 described in this embodiment, and may be suitably set.

[Process (H)]

The process (H) is a process of sealing the gap between the chip T1 and the chip T2, or the like, with the sealing material 50. Through this process, the semiconductor device 100 illustrated in FIG. 1 is completed.

(Thermosetting Resin Composition)

As described above, the thermosetting resin composition configuring the thermosetting resin layer 5 contains the epoxy resin, the curing agent, and the elastomer, and as necessary, further contains the inorganic filler, the curing accelerator, and the like. According to the studies of the present inventors, it is preferable that the support piece Da and the support piece Dc after curing have the following properties:

Property 1: when the support piece Da is thermally compressed in a predetermined position of the substrate 10, a position shift is less likely to occur (a melt viscosity of the bonding adhesive piece 5p at 120° C., for example, is 4300 to 50000 Pa·s or 5000 to 40000 Pa·s);

Property 2: in the semiconductor device 100, the bonding adhesive piece 5c exhibits stress relieving properties (the thermosetting resin composition contains the elastomer (a rubber component));

Property 3: adhesion strength with respect to the bonding adhesive piece Tc of the adhesive piece-attached chip is sufficiently high (die shear strength of the bonding adhesive piece 5c with respect to the bonding adhesive piece Tc, for example, is 2.0 to 7.0 Mpa or 3.0 to 6.0 Mpa);

Property 4: a contraction rate associated with curing is sufficiently small;

Property 5: the visibility of the support piece Da by a camera is excellent in the pickup process (the thermosetting resin composition, for example, contains a colorant); and Property 6: the bonding adhesive piece 5c has sufficient mechanical strength.

[Epoxy Resin]

The epoxy resin is not particularly limited insofar as having an adhesion function by curing. A difunctional epoxy resin such as a bisphenol A type epoxy resin, a bisphenol F type epoxy resin, and a bisphenol S type epoxy resin, a novolac type epoxy resin such as a phenol novolac type epoxy resin and a cresol novolac type epoxy resin, and the like can be used. In addition, generally known epoxy resins such as a polyfunctional epoxy resin, a glycidyl amine type epoxy resin, a heterocyclic ring-containing epoxy resin, or an alicyclic epoxy resin can be applied. One type of the epoxy resins may be independently used, or two or more types thereof may be used together.

[Curing Agent]

Examples of the curing agent include a phenolic resin, an ester compound, aromatic amine, aliphatic amine, and an acid anhydride. Among them, the phenolic resin is preferable from the viewpoint of attaining high die shear strength. Examples of a commercially available product of the phenolic resin include LF-4871 (Product Name, a BPA novolac type phenolic resin), manufactured by DIC Corporation, HE-100C-30 (Product Name, a phenyl aralkyl type phenolic resin), manufactured by AIR WATER INC., PHENOLITE KA and TD series, manufactured by DIC Corporation, Milex XLC-series and XL series (for example, Milex XLC-LL), manufactured by Mitsui Chemicals, Inc., HE series (for example, HE100C-30), manufactured by AIR WATER INC., MEHC-7800 series (for example, MEHC-7800-4S), manufactured by MEIWA PLASTIC INDUSTRIES, LTD., and JDPP series, manufactured by JFE Chemical Corporation. One type of the curing agents may be independently used, or two or more types thereof may be used together.

In a compounding amount of the epoxy resin and the phenolic resin, an equivalent ratio of an epoxy equivalent and a hydroxyl group equivalent is preferably 0.6 to 1.5, is more preferably 0.7 to 1.4, and is even more preferably 0.8 to 1.3, from the viewpoint of attaining high die shear strength. By setting a compounding ratio to be in the range described above, both of curing properties and fluidity are easily attained to a sufficiently high level.

[Elastomer]

Examples of the elastomer include an acrylic resin, a polyester resin, a polyamide resin, a polyimide resin, a silicone resin, polybutadiene, acrylonitrile, epoxy-modified polybutadiene, maleic anhydride-modified polybutadiene, phenol-modified polybutadiene, and carboxy-modified acrylonitrile.

As the elastomer, an acrylic resin is preferable, and an acrylic resin such as an epoxy group-containing (meth) acrylic copolymer obtained by polymerizing a functional monomer having an epoxy group or a glycidyl group as a cross-linkable functional group, such as glycidyl acrylate or glycidyl methacrylate, is more preferable, from the viewpoint of attaining high die shear strength. Among the acrylic resins, an epoxy group-containing (meth)acrylic acid ester copolymer and epoxy group-containing acrylic rubber are preferable, and the epoxy group-containing acrylic rubber is more preferable. The epoxy group-containing acrylic rubber is rubber having an epoxy group that contains acrylic acid ester as a main component and mainly contains a copolymer such as butyl acrylate and acrylonitrile, and a copolymer such as ethyl acrylate and acrylonitrile, and the like. Note that, the acrylic resin may have not only the epoxy group but also a cross-linkable functional group such as alcoholic or phenolic hydroxyl group and carboxyl group.

Examples of a commercially available product of the acrylic resin include SG-70L, SG-708-6, WS-023 EK30, SG-280 EK23, and a SG-P3 solvent-changed product (Product Name, acrylic rubber, Weight Average Molecular Weight: 800000, Tg: 12° C., Solvent: cyclohexanone), manufactured by Nagase ChemteX Corporation, and the like.

A glass transition temperature (Tg) of the acrylic resin is preferably −50 to 50° C., and is more preferably −30 to 30° C., from the viewpoint of attaining high die shear strength. A weight average molecular weight (Mw) of the acrylic resin is preferably 100000 to 3000000, and is more preferably 500000 to 2000000, from the viewpoint of attaining high die shear strength. Here, Mw indicates a value that is measured by gel permeation chromatography (GPC) and is converted by using a calibration curve of standard polystyrene. Note that, there is a tendency that a highly elastic bonding adhesive piece can be formed by using the acrylic resin having a narrow molecular weight distribution.

The amount of acrylic resin contained in the thermosetting resin composition is preferably 10 to 200 parts by mass, and is more preferably 20 to 100 parts by mass, with respect to the total of 100 parts by mass of the epoxy resin and an epoxy resin curing agent, from the viewpoint of attaining high die shear strength.

[Inorganic Filler]

Examples of the inorganic filler include aluminum hydroxide, magnesium hydroxide, calcium carbonate, magnesium carbonate, calcium silicate, magnesium silicate, calcium oxide, magnesium oxide, aluminum oxide, aluminum nitride, aluminum borate whisker, boron nitride, crystalline silica, and amorphous silica. One type of the inorganic fillers may be independently used, or two or more types thereof may be used together.

An average particle diameter of the inorganic filler is preferably 0.005 μm to 1.0 μm, and is more preferably 0.05 to 0.5 μm, from the viewpoint of attaining high die shear strength. It is preferable that the surface of the inorganic filler is chemically modified, from the viewpoint of attaining high die shear strength. A silane coupling agent is suitable as a material for chemically modifying the surface. Examples of the type of functional group of the silane coupling agent include a vinyl group, an acryloyl group, an epoxy group, a mercapto group, an amino group, a diamino group, an alkoxy group, and an ethoxy group.

The content of the inorganic filler is preferably 20 to 200 parts by mass, and is more preferably 30 to 100 parts by mass, with respect to 100 parts by mass of resin components of the thermosetting resin composition, from the viewpoint of attaining high die shear strength.

[Curing Accelerator]

Examples of the curing accelerator include imidazoles and derivatives thereof, an organic phosphorus-based compound, secondary amines, tertiary amines, and a quaternary ammonium salt. An imidazole-based compound is preferable from the viewpoint of attaining high die shear strength. Examples of the imidazoles include 2-methyl imidazole, 1-benzyl-2-methyl imidazole, 1-cyanoethyl-2-phenyl imidazole, 1-cyanoethyl-2-methyl imidazole, and the like. One type of the curing accelerators may be independently used, or two or more types thereof may be used together.

The content of the curing accelerator in the thermosetting resin composition is preferably 0.04 to 3 parts by mass, and is more preferably 0.04 to 0.2 parts by mass, with respect to the total of 100 parts by mass of the epoxy resin and the epoxy resin curing agent, from the viewpoint of attaining high die shear strength.

Second Embodiment

Figure 9:
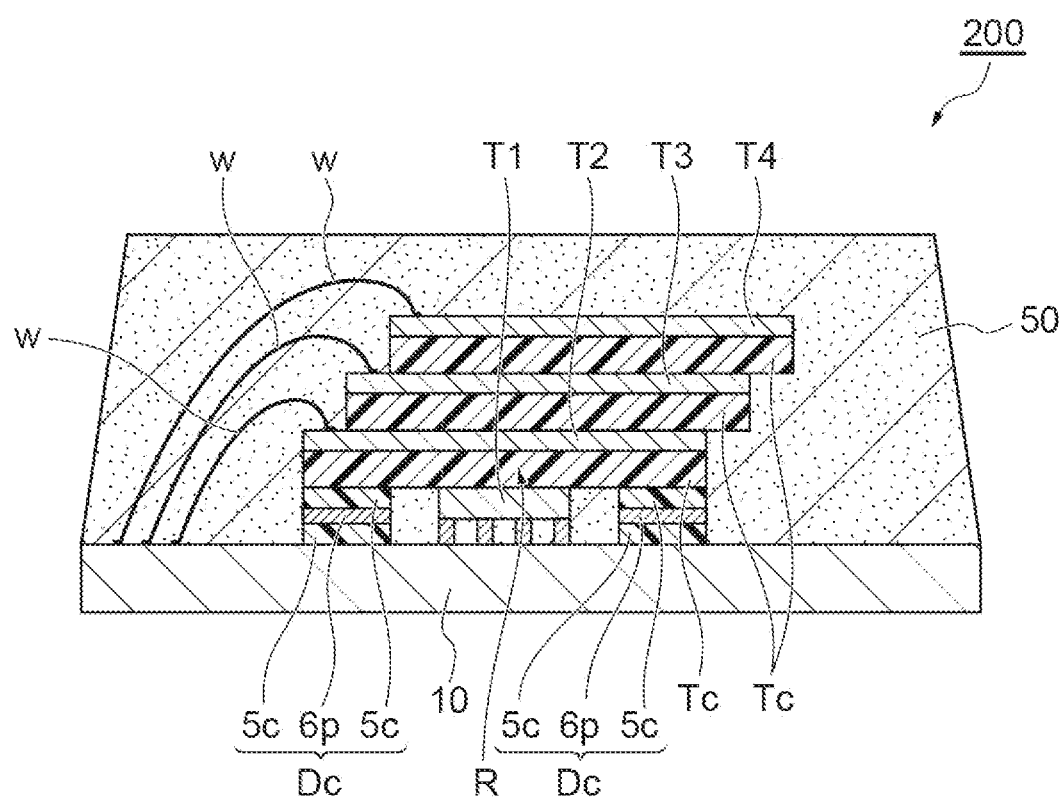
FIG. 9 is a sectional view schematically illustrating a second embodiment of the semiconductor device according to the present disclosure.

FIG. 9 is a sectional view schematically illustrating a semiconductor device according to a second embodiment. In the semiconductor device 100 according to the first embodiment, the chip T1 is apart from the bonding adhesive piece Tc, whereas in a semiconductor device 200 according to this embodiment, the chip T1 is in contact with the bonding adhesive piece Tc. That is, the bonding adhesive piece Tc is in contact with the upper surface of the chip T1 and the upper surface of the support piece Dc. For example, the position of the upper surface of the chip T1 can be coincident with the position of the upper surface of the support piece Dc by suitably setting the thickness of the support piece formation film D.

In the semiconductor device 200, the chip T1 is connected to the substrate 10 by flip chip connection but not wire bonding. Note that, even in a case where the chip T1 is connected to the substrate 10 by the wire bonding, the chip T1 can be in contact with the bonding adhesive piece Tc insofar as the wire w is embedded in the bonding adhesive piece Ta. The bonding adhesive piece Ta and the chip T2 configure the adhesive piece-attached chip T2a (refer to FIG. 8).

As illustrated in FIG. 9, the bonding adhesive piece Tc between the chip T1 and the chip T2 covers the region R of the chip T2 facing the chip T1 and continuously extends to the circumferential edge side of the chip T2 from the region R. Such one bonding adhesive piece Tc covers the region R of the chip T2 and adheres the chip T2 and the plurality of support pieces to each other by being interposed therebetween. In FIG. 9, the lower surface of the chip T2 corresponds to the back surface. As described above, recently, the concavities and convexities are commonly formed on the back surface of the chip. Since substantially the entire back surface of the chip T2 is covered with the bonding adhesive piece Tc, even in a case where the upper surface of the chip T1 is in contact with the bonding adhesive piece Tc, the occurrence of a crack or a split on the chip T2 can be suppressed.

As described above, the embodiments of the present disclosure have been described in detail, but the present invention is not limited to the embodiments described above.

Figure 10:
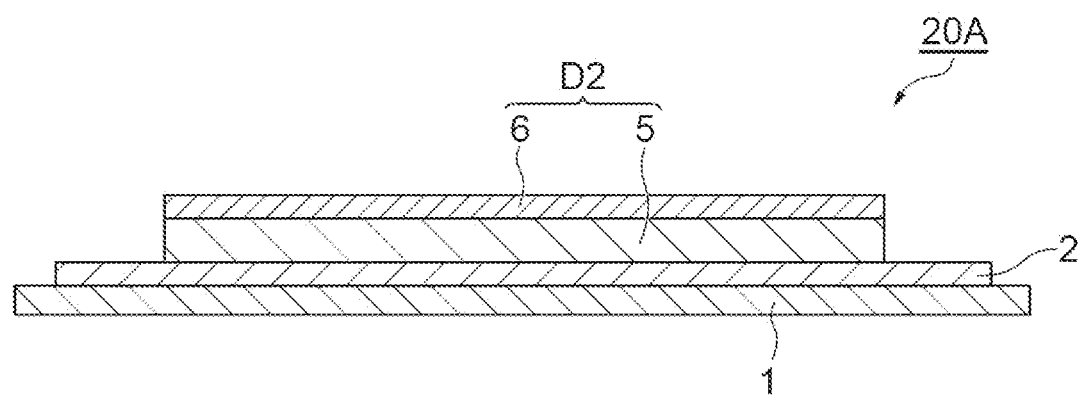
FIG. 10 is a sectional view schematically illustrating another embodiment of the support piece formation laminate film.

In the embodiments described above, as illustrated in FIG. 3B, the support piece formation laminate film 20 including the support piece formation film D having a three-layer structure has been exemplified, but the support piece formation laminate film may include two layers, or may include four or more layers. A support piece formation laminate film 20A illustrated in FIG. 10 includes a two-layer film D2 (a support piece formation film) including the thermosetting resin layer 5 and the metal layer 6. That is, in the support piece formation laminate film 20A, the thermosetting resin layer 5 is disposed between the pressure-sensitive adhesive layer 2 and the metal layer 6 that is the outermost surface.

A ratio of the thickness of the thermosetting resin layer 5 to the thickness of the two-layer film D2 is preferably 0.1 to 0.9, is more preferably 0.2 to 0.8, is even more preferably 0.35 to 0.7, and is still even more preferably 0.35 to 0.6. By setting such a ratio to be in the range described above, in the manufacturing procedure of the support piece, the pickup properties can be attained (refer to FIG. 5D). That is, in a case where the ratio is greater than or equal to 0.1, a decrease in the pickup properties of the support piece due to the intrusion of the edge of the metal piece 6p into the pressure-sensitive adhesive layer 2 can be more highly suppressed. On the other hand, in a case where the ratio is less than or equal to 0.8, the metal piece 6p has a sufficient thickness such that the metal piece 6p serves in the role of a spring plate, and more excellent pickup properties can be attained. From such a viewpoint, the thickness of the metal layer 6, for example, is 10 to 80 μm, and may be 20 to 60 μm. The thickness of the thermosetting resin layer 5, for example, is 5 to 120 μm, and may be 10 to 60 μm.

The support piece formation laminate film 20A, for example, can be manufactured through the following processes of:
  preparing a laminate film including the base material film 1, the pressure-sensitive adhesive layer 2, and the thermosetting resin layer 5, in this order; and
  bonding the metal layer 6 to the surface of the laminate film described above;
  or
  preparing a laminate film by bonding the thermosetting resin layer 5 and the metal layer 6; and
  bonding the base material film 1, the pressure-sensitive adhesive layer 2, and the laminate film described above to be provided in this order.

EXAMPLES

Hereinafter, the present disclosure will be described by Examples, but the present invention is not limited to these Examples.
(Preparation of Varnish)
A varnish for forming a thermosetting resin layer of a support piece formation film was prepared by using the following materials:
  Epoxy Resin: YDCN-700-10: (Product Name, manufactured by Nippon Steel & Sumikin Chemical Co., Ltd., a cresol novolac type epoxy resin, a solid at 25° C.) 13.2 parts by mass;
  Phenolic Resin (Curing Agent): HE-100C-30: (Product Name, manufactured by AIR WATER INC., a phenyl aralkyl type phenolic resin) 11.0 parts by mass;
  Inorganic Filler: AEROSIL R972: (Product Name, manufactured by NIPPON AEROSIL CO., LTD., silica, an average particle diameter of 0.016 µm) 7.8 parts by mass;
  Elastomer: a SG-P3 solvent-changed product: (Product Name, manufactured by Nagase ChemteX Corporation, acrylic rubber, Weight Average Molecular Weight: 800000, Tg: 12° C., Solvent: cyclohexanone) 66.4 parts by mass;
  Coupling Agent 1: A-189: (Product Name, manufactured by GE Toshiba Silicones Co., Ltd., γ-mercaptopropyl trimethoxy silane) 0.4 parts by mass;
  Coupling Agent 1: A-1160: (Product Name, manufactured by GE Toshiba Silicones Co., Ltd., γ-ureidopropyl triethoxy silane) 1.15 parts by mass;
  Curing Accelerator: CUREZOL 2PZ-CN: (Product Name, manufactured by SHIKOKU CHEMICALS CORPORATION, 1-cyanoethyl-2-phenyl imidazole) 0.03 parts by mass; and
  Solvent: cyclohexane.

Example 1

As described above, a solid content ratio of the varnish was adjusted to 40 mass % by using cyclohexanone as a solvent. The varnish was filtered with a 100-mesh filter and was vacuum-defoamed. As a film to be coated with the varnish, a polyethylene terephthalate (PET) film (a thickness of 38 µm) subjected to a mold release treatment was prepared. The varnish after being vacuum-defoamed was applied onto the surface of the PET film that had been subjected to the mold release treatment. The applied varnish was heated and dried in two stages at 90° C. for 5 minutes, and then, at 140° C. for 5 minutes. Accordingly, a thermosetting resin layer in a B-stage state (a semi-cured state) was formed on the surface of the PET film. A copper foil (Thickness: 18 µm) was pasted to the surface of the thermosetting resin layer on a hot plate at 70° C. to prepare a support piece formation film having the same configuration as that of the two-layer film D2 illustrated in FIG. 10 on the surface of the PET film.

A laminate film (a dicing tape) including a pressure-sensitive adhesive layer was prepared in the following procedure. In an adhesive agent, 2-ethyl hexyl acrylate and methyl methacrylate were used as a main monomer, and an acrylic copolymer using hydroxy ethyl acrylate and an acrylic acid as a functional group monomer was obtained by a solution polymerization method. A weight average molecular weight of the synthesized acrylic copolymer was 400000, and a glass transition point was −38° C. An adhesive agent solution was prepared in which 100 parts by mass of the acrylic copolymer was compounded with 10 parts by mass of a polyfunctional isocyanate cross-linking agent (manufactured by Mitsubishi Chemical Corporation, Product Name: MITEC NY730A-T), and was applied onto the surface of polyethylene terephthalate (a thickness of 25 µm) that had been subjected to a mold release treatment and was dried such that the thickness of the adhesive agent at the time of drying was 10 µm. Further, 100 µm of a polyolefin base material containing polypropylene/vinyl acetate/polypropylene was laminated on an adhesive agent surface. Such an adhesive film was left to stand at a room temperature for 2 weeks and was sufficiently aged to obtain the dicing tape.

The support piece formation film (a two-layer film of the thermosetting resin layer and the copper foil) was bonded to the pressure-sensitive adhesive layer of the dicing tape on a hot plate at 70° C. by using a rubber roll such that the surface of the support piece formation film including the thermosetting resin layer faced the pressure-sensitive adhesive layer. Accordingly, a laminated body of the support piece formation film and the dicing tape was obtained. The thickness of the thermosetting resin layer was 25 µm.

Example 2

A laminated body of a support piece formation film and a dicing tape was obtained as with Example 1, except that an aluminum foil (a thickness of 25 µm) was used instead of the copper foil (Thickness: 18 µm).

The support piece formation films of Examples were subjected to the following evaluation.
(1) Peeling Strength
The laminated bodies including the support piece formation films according to Examples were respectively cut to have a width of 25 mm and a length of 100 mm, and test pieces were prepared. Peeling strength (Peeling Angle: 180°, Peeling Rate: 300 mm/minute) on the interface between the pressure-sensitive adhesive layer and the support piece formation film was measured. In each of Examples, the measurement was performed three times, and average values thereof are shown below:
  Example 1: 0.4 N/25 mm; and
  Example 2: 0.4 N/25 mm
(2) Pickup Properties
The laminated bodies of the support piece formation films (Shape: a circular shape having a diameter of 320 mm) according to Examples, and the dicing tape (Shape: a circular shape having a diameter of 335 mm) were prepared. A dicing ring was laminated on the dicing tape of the laminated body in a condition of 70° C. The support piece formation film was singulated by using a dicer in a condition of a height of 55 µm. Accordingly, a support piece having a size of 10 mm×10 mm was obtained. One surface of a double-faced tape (Size: 8 mm×8 mm) was pasted to the support piece, and a jig was pasted to the other surface. A tensile force at the time of peeling was measured by pulling the jig with a push-pull gauge (manufactured by IMADA Co., Ltd.). In each of Examples, the measurement was performed five times, and average values thereof are shown below:

Example 1: 4.4 N/25 mm; and
Example 2: 4.6 N/25 mm

INDUSTRIAL APPLICABILITY

According to the present disclosure, a manufacturing method for a semiconductor device is provided in which in a manufacturing process of a semiconductor device having a dolmen structure, a process of preparing a support piece can be simplified, and excellent pickup properties of the support piece can be attained. In addition, according to the present disclosure, a semiconductor device having a dolmen structure, and a support piece formation laminate film and a manufacturing method therefor are provided.

REFERENCE SIGNS LIST

1: base material film, 2: pressure-sensitive adhesive layer, 5: thermosetting resin layer, 5c: bonding adhesive piece (cured product), 5p: bonding adhesive piece, 6: metal layer, 6p: metal piece, 10: substrate, 20, 20A: support piece formation laminate film, 50: sealing material, 100, 200: semiconductor device, D: support piece formation film, D2: two-layer film (support piece formation film), Da, Dc: support piece, R: region, T1: first chip, T2: second chip, T2a: adhesive piece-attached chip, Ta, Tc: bonding adhesive piece.

The invention claimed is:

1. A manufacturing method for a semiconductor device having a dolmen structure, the semiconductor device comprising: a substrate; a first chip disposed on the substrate; a plurality of support pieces disposed around the first chip on the substrate; and a second chip disposed to be supported by the plurality of support pieces and to cover the first chip, the method comprising processes of:
(A) preparing a laminate film comprising a base material film, a pressure-sensitive adhesive layer and a support piece formation film in order, wherein the support piece formation film has a multi-layer structure comprising a metal layer and a thermosetting resin layer that is in contact with the metal layer and with the pressure-sensitive adhesive layer;
(B) forming the plurality of support pieces on a surface of the pressure-sensitive adhesive layer by singulating the support piece formation film;
(C) picking up the plurality of support pieces from the pressure-sensitive adhesive layer;
(D) disposing the first chip on the substrate;
(E) disposing the plurality of support pieces onto the substrate around the first chip or around a region in which the first chip is to be disposed on the substrate;
(F) preparing an adhesive piece-attached chip comprising the second chip and a bonding adhesive piece provided on one surface of the second chip; and
(G) constructing the dolmen structure by disposing the adhesive piece-attached chip on surfaces of the plurality of support pieces.

2. The manufacturing method according to claim 1, wherein a process of irradiating the pressure-sensitive adhesive layer with an ultraviolet ray is not provided between the process (B) and the process (C).

3. The manufacturing method according to claim 1, wherein the method further comprises a process of heating the support piece formation film or the plurality of support pieces before the process (G) to cure the thermosetting resin layer.

4. The manufacturing method according to claim 1, wherein the thermosetting resin layer in preparing the laminate film, has a melt viscosity at 120° C. of 4,300 to 50,000 Pa·s, to inhibit a position shift of the plurality of support pieces relative to the substrate.

* * * * *